United States Patent
Delaunay et al.

(10) Patent No.: US 11,075,061 B2
(45) Date of Patent: Jul. 27, 2021

(54) DEVICE FOR PRODUCING AN AMORPHOUS CARBON LAYER BY ELECTRON CYCLOTRON RESONANCE PLASMA

(71) Applicant: COMMISSARIAT A L'ENERGIE ATOMIQUE ET AUX ENERGIES ALTERNATIVES, Paris (FR)

(72) Inventors: Marc Delaunay, Meylan (FR); Anne Ghis, Saint Martin d'Heres (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 454 days.

(21) Appl. No.: 15/771,462

(22) PCT Filed: Oct. 25, 2016

(86) PCT No.: PCT/FR2016/052763
§ 371 (c)(1),
(2) Date: Apr. 27, 2018

(87) PCT Pub. No.: WO2017/072434
PCT Pub. Date: May 4, 2017

(65) Prior Publication Data
US 2018/0315584 A1    Nov. 1, 2018

(30) Foreign Application Priority Data
Oct. 27, 2015 (FR) ........................................ 1560224

(51) Int. Cl.
*H01J 37/32* (2006.01)
*C23C 14/06* (2006.01)
(Continued)

(52) U.S. Cl.
CPC .... *H01J 37/32678* (2013.01); *C23C 14/0605* (2013.01); *C23C 14/357* (2013.01);
(Continued)

(58) Field of Classification Search
CPC ................................ C23C 14/34; C23C 14/35
See application file for complete search history.

(56) References Cited

U.S. PATENT DOCUMENTS 5,022,977 A * 6/1991 Matsuoka ............... H01J 27/18
204/192.12
5,045,166 A * 9/1991 Bobbio .................. B01J 19/087
118/723 ER
2005/0145339 A1    7/2005 Matsuo et al.

FOREIGN PATENT DOCUMENTS

EP     0 148 504 A     7/1985
EP     0 283 519 A1    9/1988
(Continued)

OTHER PUBLICATIONS

International Search Report as issued in International Patent Application No. PCT/FR2016/052763, dated Feb. 6, 2017.

*Primary Examiner* — John J Brayton
(74) *Attorney, Agent, or Firm* — Pillsbury Winthrop Shaw Pittman LLP

(57) ABSTRACT

A device for producing an amorphous carbon layer by electron cyclotron resonance plasma, the device including a plasma chamber; a gas supply; a magnetic mirror; a waveguide extending along a reference axis; a system for injecting microwave power; a magnetic field generator for generating a magnetic field in the plasma chamber, the magnetic field generator being configured to create a beam of magnetic field lines along which plasma is diffused; a target made from carbon; a substrate holder, wherein the target is arranged at a distance from the reference axis of between $R_{target}/2$ and $R_{target}$, and wherein the device further includes
(Continued)

a screen arranged between the waveguide and the substrate holder.

5 Claims, 2 Drawing Sheets

(51) Int. Cl.
  *C23C 14/35* (2006.01)
  *H05H 1/46* (2006.01)
  *H01J 37/34* (2006.01)

(52) U.S. Cl.
  CPC .... *H01J 37/3266* (2013.01); *H01J 37/32192* (2013.01); *H01J 37/32229* (2013.01); *H01J 37/32651* (2013.01); *H01J 37/345* (2013.01); *H05H 1/46* (2013.01); *H01J 37/3426* (2013.01); *H05H 2001/4622* (2013.01); *H05H 2245/124* (2013.01)

(56) References Cited

FOREIGN PATENT DOCUMENTS

| | | | |
|---|---|---|---|
| EP | 0 778 608 A2 | | 6/1997 |
| FR | 2 774 251 A1 | | 7/1999 |
| JP | S62-224686 A | | 10/1987 |
| JP | 2000072415 A | * | 3/2000 |
| WO | WO 2015/145486 A1 | | 10/2015 |

* cited by examiner

DEVICE FOR PRODUCING AN AMORPHOUS CARBON LAYER BY ELECTRON CYCLOTRON RESONANCE PLASMA

CROSS-REFERENCE TO RELATED APPLICATIONS

This is the U.S. National Stage of PCT/FR2016/052763, filed Oct. 25, 2016, which in turn claims priority to French Application No. 1560224, filed Oct. 27, 2015, the entire contents of all applications are incorporated herein by reference in their entireties.

TECHNICAL FIELD

The present invention relates to a device for producing an amorphous carbon layer by electron cyclotron resonance plasma.

PRIOR ART

The deposition of carbon layers by electron cyclotron resonance plasma is known from the prior art. Thus, the document FR2774251 describes a device for the deposition of carbon by electron cyclotron resonance plasma. This device makes it possible to deposit carbon by physical vapour deposition (PVD) by sputtering a carbon target thanks to an electron cyclotron resonance plasma (also called ECR plasma). ECR plasmas in fact have the interest of being able to be generated in an autonomous manner without filament or cathode, from an electron cyclotron resonance zone, which generates energetic electrons, which ionise a gas injected into a plasma chamber in such a way as to produce plasma. Said plasma diffuses along a beam of magnetic field lines. The beam is intercepted by the carbon target to be sputtered. Carbon atoms are then sputtered from the target, which is negatively polarised, and they reach a substrate on which they are deposited.

However, these devices of the prior art are very bulky and the substrate holder is distant from the plasma which implies very slow deposition rates. Furthermore, homogeneity of the layers is only obtained thanks to translational/rotational movements of the support during deposition, which implies very sophisticated devices.

Other solutions have then been implemented to bring the substrate holder closer. For example in the document US2005/0145339, the substrate holder is placed in the axis of the plasma but the substrate is then impacted by plasma particles which can deteriorate the substrate and the deposited layer.

DESCRIPTION OF THE INVENTION

The invention aims to overcome the drawbacks of the prior art by proposing a device for producing an elastic layer of amorphous carbon by electron cyclotron resonance plasma which makes it possible to produce amorphous carbon layers of low thickness, continuous, homogenous, elastic, of which the sp3 bond level is greater than 20%, and on any type of substrate.

To achieve this, according to a first aspect of the invention, a device is proposed for producing an amorphous carbon layer by electron cyclotron resonance plasma, the device comprising:
a plasma chamber;
means for conveying a gas into the plasma chamber,
a magnetic confinement mirror,
a waveguide inserted into the plasma chamber, the waveguide extending along a reference axis;
means for injecting a microwave electromagnetic wave arranged to inject a microwave electromagnetic wave into the plasma chamber thanks to the waveguide,
means for generating a magnetic field in the plasma chamber, the injection means and the generating means being configured to form an electron cyclotron resonance zone in the plasma chamber, the means for generating the magnetic field being further configured to create a beam of magnetic field lines along which plasma is diffused, the plasma extending along the reference axis, the plasma having an edge;
a target made from carbon to be sputtered;
a substrate holder arranged to hold a substrate;
Characterised in that:
the target is arranged at a distance from the reference axis of between $R_{target}/2$ and $R_{target}$, where $R_{target}$ is the distance, at the level of the target, between the edge of the plasma and the reference axis,
and in that
the device further comprises a screen arranged between the waveguide and the substrate holder.

In operation, the means for generating a magnetic field and the means for injecting a microwave electromagnetic wave enable the creation of an electron cyclotron resonance zone, which generates energetic electrons, which ionise the gas injected into the plasma chamber in such a way as to produce plasma. The means for generating the magnetic field generate, in the magnetic confinement mirror, a beam of magnetic field lines along which plasma is diffused. Said beam of magnetic field lines extends along the same reference axis as the waveguide. The edge of the beam of magnetic field lines is at a distance from the reference axis equal to R. Said distance R can vary as a function of the section of the beam of magnetic field lines at the level of which it is placed.

The fact of positioning the target at a distance from the reference axis of between $R_{target}/2$ and $R_{target}$ makes it possible not to perturb the plasma too much while at the same time plunging the target sufficiently into the plasma so that it receives sufficient ions to be sputtered over its entire surface.

The screen makes it possible to protect the substrate since it partially intercepts the magnetic field lines. The screen thus makes it possible to protect the substrate and the amorphous carbon layer deposited above, from the flux of electrons and ions of the plasma.

The device according to the invention may also have one of the following characteristics taken individually or according to all technically possible combinations thereof.

Advantageously, the target and the substrate holder are arranged facing each other, in such a way that the majority of the carbon atoms that are torn from the target are going to be deposited on the substrate.

Advantageously, the screen extends perpendicularly to the reference axis, which enables the screen to protect efficiently the substrate from plasma impacts without however hindering the displacement of carbon atoms from the target to the substrate.

Advantageously, the screen is constituted of a non-magnetic material, in such a way that the screen does not perturb the beam of magnetic field lines.

Advantageously, the screen is constituted of an electrically conductive material, in such a way as to evacuate charges from the plasma.

Advantageously, the target is arranged substantially parallel to the reference axis, in order not to perturb the plasma.

Advantageously, the substrate holder is arranged substantially parallel to the reference axis, in order to limit impacts of plasma on the substrate.

Advantageously, the substrate holder is arranged at a distance from the reference axis such that the substrate is arranged outside of the beam of magnetic field lines. To do so, the substrate holder is preferably arranged at a distance from the reference axis greater than R, where R is the distance between the edge of the beam of magnetic field lines and the reference axis. Impacts of plasma on the substrate are thereby further limited.

Advantageously, the device comprises means for polarising the target arranged to electrically polarise the target.

Advantageously, the device further comprises a substrate made from organic material, arranged on the substrate holder, which makes it possible to deposit the amorphous carbon layer on a substrate made from organic material, in such a way as to be able to dissolve it more easily thereafter if necessary. The organic material is preferably a polymer. The polymer is for example PMMA. Indeed, the device is particularly advantageous because it enables the deposition of the amorphous carbon layer on substrates which are not heated, which are not electrically polarised and which are not impacted by particles of plasma, such that it is possible to use fragile substrates, for example made from polymer, which was not the case with devices of the prior art.

Advantageously, the conveying means are configured to inject a noble gas into the plasma chamber. Said noble gas is preferably argon or krypton.

Advantageously, the target is arranged in a zone of the confinement mirror at the level of which the magnetic field B is minimum

BRIEF DESCRIPTION OF THE FIGURES

Other characteristics and advantages of the invention will become clear from reading the detailed description that follows, with reference to the appended figures, which illustrate.

For greater clarity, identical or similar elements are marked by identical reference signs in all of the figures.

DETAILED DESCRIPTION OF AT LEAST ONE EMBODIMENT

Figure 1:
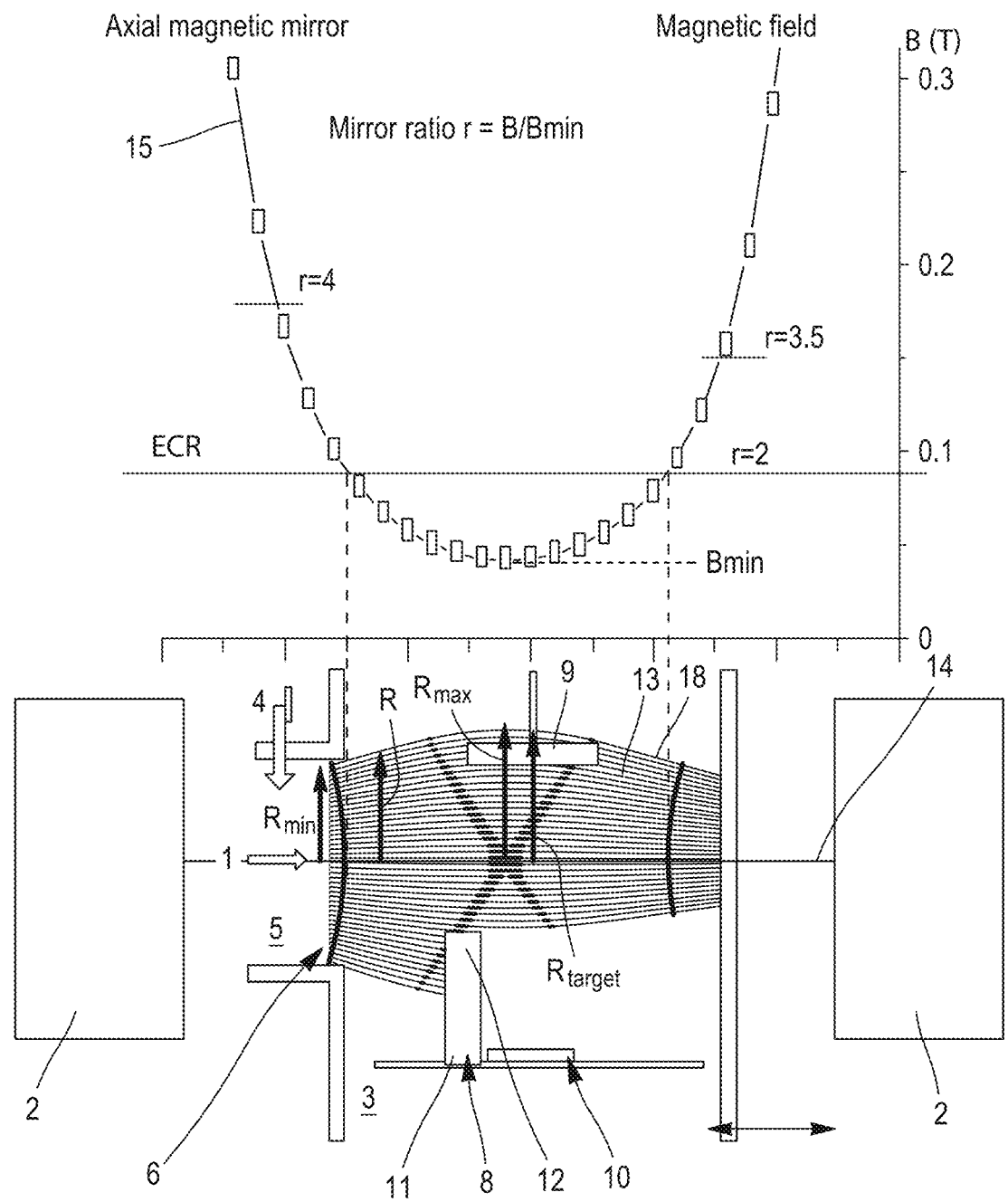
FIG. 1, a schematic representation of a device according to one embodiment of the invention.
Figure 2:
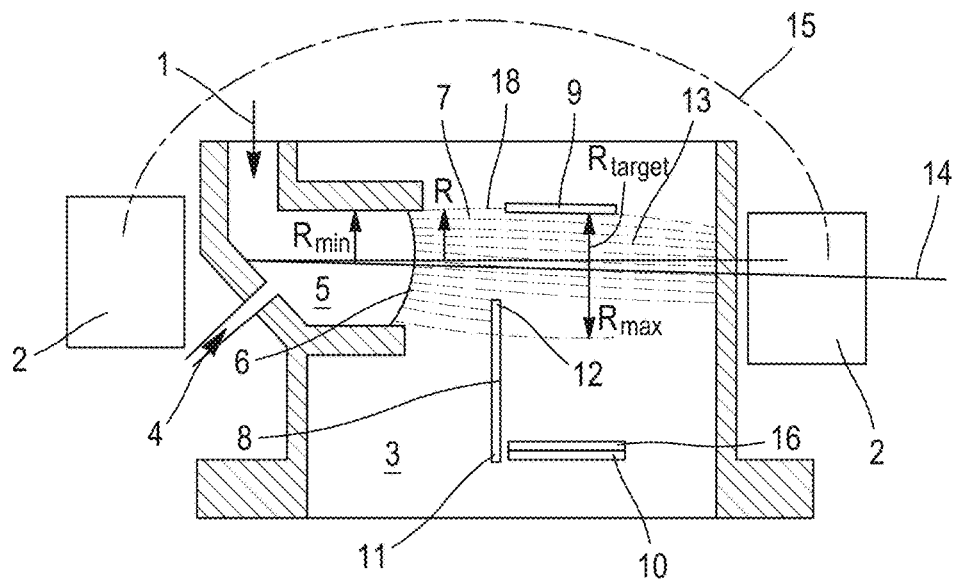
FIG. 2, another schematic representation of the device of FIG. 1.

FIGS. 1 and 2 represent a device according to one embodiment of the invention. Said device comprises:
- a plasma chamber 3;
- means for conveying 4 a gas into the plasma chamber. The conveying means 4 are preferably configured to convey, into the plasma chamber, a noble gas to ionise in such a way as to form a plasma. Said noble gas is preferably argon or krypton;
- a magnetic confinement mirror 15. The magnetic mirror 15 preferably comprises two solenoids or two permanent magnet blocks.
- means 1 for injecting a microwave electromagnetic wave. Said injection means 1 comprise in particular a microwave electromagnetic wave generator. Said microwave electromagnetic wave preferably has a frequency of 2.45 GHz;
- a waveguide 5 inserted into the plasma chamber 3 and through which the injection means 1 inject the microwave electromagnetic wave into the plasma chamber 3. The part of the waveguide inserted into the plasma chamber extends along a reference axis. The part of the waveguide inserted into the plasma chamber has a symmetry with respect to the reference axis 14;
- means 2 for generating a magnetic field in the plasma chamber 3. Said generating means 2 preferably comprise permanent magnets or solenoids.

The generating means 2 and the injection means 1 are capable of creating at least one electron cyclotron resonance zone 6, also called ECR zone, in the plasma chamber 3 or in the waveguide, and more precisely in the magnetic mirror 15. This electron cyclotron resonance zone 6 makes it possible to accelerate the electrons which are going to ionise the injected gas, by electron impact, and thereby generate plasma.

The means 2 for generating the magnetic field are further configured to create, in the magnetic confinement mirror 15, a beam 13 of magnetic field lines along which the created plasma 7 is diffused. The beam 13 of magnetic field lines comes from the ECR zone. The beam of magnetic field lines extends along the reference axis 14. The plasma thus also extends along the reference axis 14.

The beam of magnetic field lines may have a cylindrical or rectangular section. The beam is in general biconvex. The beam of magnetic field lines, and thus the plasma, have an edge 18 that delimits the beam of magnetic field lines and thus the plasma. This edge 18 is distant from the reference axis by a distance R. This distance R varies as a function of the point from the reference axis at the level of which it is located. Indeed, since the edge of the plasma may be more or less convex, the distance R can vary between a maximum distance $R_{max}$, and a minimum distance $R_{min}$.

Since the plasma remains localised on the beam 13 of magnetic field lines, it thus has a well-defined shape, and it has the same axis and the same dimensions as the beam 13.

The device also comprises a carbon target 9 to be sputtered. The ions of the plasma strike the target 9 and eject carbon atoms. The device may also comprise means for polarising the target arranged to polarise, preferably negatively, the target 9.

The device also comprises a substrate holder 10 capable of holding a substrate 16 on which it is wished to deposit a carbon layer. The carbon atoms ejected from the target 9 are deposited on the substrate 16 to form an amorphous carbon layer.

The target 9 is arranged at the edge of the plasma, instead of being arranged in the axis of the plasma. More precisely, the part of the edge 18 of the plasma that is situated at the level of the target is located at a distance from the reference axis 14 equal to $R_{target}$. When the beam of magnetic field lines has a cylindrical section, $R_{target}$ thus the radius of the transversal section of the beam of magnetic field lines at the level of which the target is placed. When the beam of magnetic field lines has a rectangular section, $2*R_{target}$ thus represents the height of the transversal section of the beam of magnetic field lines at the level of which the target is placed. The target 9 is arranged at a distance from the reference axis of between $R_{target}/2$ and $R_{target}$.

The target is preferably arranged in the confinement mirror, advantageously at the spot where the magnetic field B is minimum.

The target is preferably arranged substantially parallel to the reference axis.

The substrate holder 10 is arranged facing the target 9 on an edge opposite to the plasma. The substrate holder 10 is preferably arranged substantially parallel to the target. The substrate holder is preferably arranged outside of the plasma. To do so, the substrate holder 10 is preferably arranged at a distance from the reference axis greater than $R_{target}$.

In order to protect the substrate from impacts of plasma, a screen 8 is arranged in front of the substrate holder 10. The screen 8 is arranged between the waveguide 5 and the substrate holder 10. The screen 8 is preferably formed of a plate, for example flat. The screen preferably comprises a first end 11 substantially aligned with the substrate holder. The screen comprises a second end 12 plunged into the plasma to locally stop particles of plasma capable of impacting the substrate. This arrangement thereby makes it possible to place the substrate holder at a short distance from the target while avoiding its deterioration by impacts of plasma. The screen preferably has a width substantially equal to the width of the substrate holder.

The screen 8 is preferably constituted of a non-magnetic material in order not to perturb the magnetic field in the plasma chamber. Moreover, the screen 8 is preferably constituted of an electrically conductive material in order to contribute to the evacuation of charges from the plasma chamber.

The device according to the invention is particularly advantageous in that it makes it possible to produce amorphous carbon layers of low thickness, that is to say of thickness of between 1 and 5 nm, continuous, homogenous and elastic, which was not the case of devices of the prior art. Indeed, the device makes it possible to obtain carbon layers having sp3 bond levels greater than 20% and thus Young's moduli of around 200 GPa. Moreover, it makes it possible to produce such layers without having to resort to an ion beam sputtering method, without heating the substrate and without polarising it. It is thus possible to deposit the amorphous carbon layer on any type of substrate and notably on polymer substrates. It is thereby notably possible to deposit a carbon layer on substrates made from plastic, polymethylmethacrylate (PMMA), OLED (Organic Light Emitter Diode).

Figure 3A:
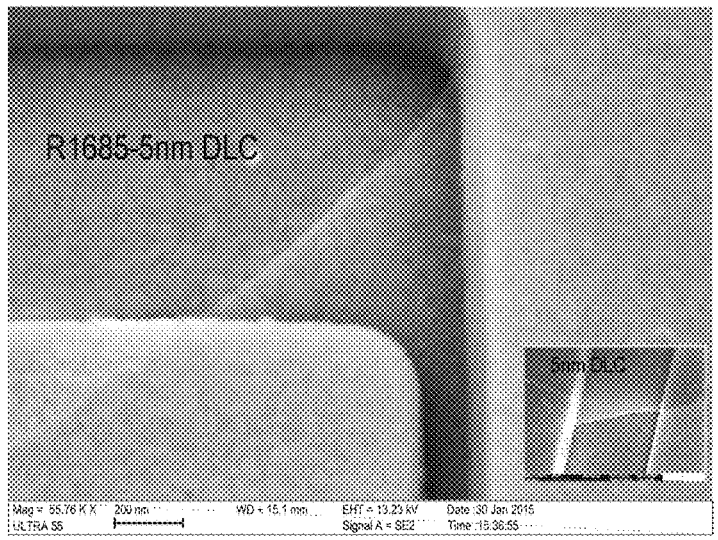
FIG. 3a, an observation by scanning electron microscope (SEM) of an amorphous carbon layer obtained in the device of FIGS. 1 and 2 and transferred onto an electronic circuit.
Figure 3B:
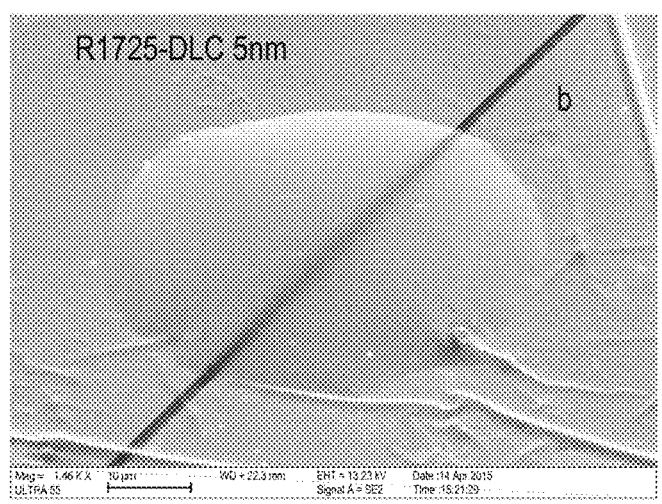
FIG. 3b, another observation by scanning electron microscope of the layer of FIG. 3a under which a gas bubble has been trapped.

FIGS. 3a and 3b thereby represent an amorphous carbon layer transferred onto an electronic circuit and produced in a device similar to that of FIGS. 1 and 2. To produce this amorphous carbon layer, the microwave electromagnetic wave injected by the injection means had a frequency of 2.45 GHz and a power of 282 W. Electron cyclotron resonance occurred when the magnetic field B created by the generating means was equal to 0.0875 T. The gas injected into the plasma chamber by the conveying means was krypton injected at a pressure of $5.10^{-4}$ mbar. The target made from carbon was polarised to −402V and 0.1 A. The deposition of carbon was carried out for 12 min, which made it possible to obtain an amorphous carbon layer of 5 nm thickness. The deposition rate was thus 0.42 nm/min. The magnetic field had a minimum at 0.05 T.

The Larmor radius of the electrons for two transversal kinetic energies $E_e$ was calculated. The values obtained are the following:

| $E_e$ | B = 0.05 T | B = 0.0875 T |
|---|---|---|
| 1 eV | 0.066 mm | 0.038 mm |
| 100 eV | 0.6 mm | 0.38 mm |

The electrons were thus accelerated in the electron cyclotron resonance zone and diffused along the magnetic field lines on helicoidal trajectories with Larmor radii of small dimensions, that is to say less than one millimetre.

Observation by transmission electron microscope (TEM) of the carbon layer obtained makes it possible to confirm that it is indeed amorphous without crystallisation. An analysis of said amorphous carbon layer by X-ray photoelectron spectrometry (XPS) indicates that the carbon layer has a sp3 bond level of 25%, which corresponds to a Young's modulus of around 200 GPa. The elasticity of the carbon layer is confirmed by FIG. 3b in which it may be seen that it is possible to trap an air bubble underneath the carbon layer without said layer fissuring.

Naturally, the invention is not limited to the embodiments described with reference to the figures and alternatives could be envisaged without going beyond the scope of the invention.

The potential applications of these amorphous carbon layers are, on the one hand, the production of MEMS (Micro Electro Mechanical Systems), CMUT (Capacitive Micromachined Ultrasonic Transducers) and suspended membrane microresonators in particular by transfer of layers and, on the other hand, the packaging of organic devices (OLED type), the protection of devices in aggressive media (acid, base, etc.) and the leak tightness of devices in the presence of light gas (hydrogen, helium).

The invention claimed is:

1. A device for producing an amorphous carbon layer by electron cyclotron resonance plasma, the device comprising:
   a plasma chamber;
   a gas supply for conveying a gas into the plasma chamber;
   a magnetic confinement mirror;
   a waveguide inserted into the plasma chamber, the waveguide extending along a reference axis;
   a microwave electromagnetic wave injection system arranged to inject a microwave electromagnetic wave into the plasma chamber via the waveguide;
   a magnetic field generator configured to generate a magnetic field in the plasma chamber, the injection system and the magnetic field generator being configured to form an electron cyclotron resonance zone in the plasma chamber, the magnetic field generator for generating the magnetic field being further configured to create a beam of magnetic field lines extending along the reference axis along which plasma is diffused such that the plasma extends along the reference axis, the plasma having an edge;
   a target made from carbon to be sputtered;
   a substrate holder arranged to hold a substrate;
   wherein
      the target is arranged parallel to the reference axis and at a distance from the reference axis of between $R_{target}/2$ and $R_{target}$, where $R_{target}$ is the distance measured along a straight line through the target between the edge of the plasma and the reference axis, and wherein
      the device further comprises a screen arranged between the waveguide and the substrate holder, the screen extending perpendicularly to the reference axis and locally stopping plasma particles capable of impacting the substrate;

the substrate holder is arranged parallel to the reference axis and at a distance from the reference axis greater than $R_{target}$ such that the substrate is arranged outside of the plasma;

the target and the substrate holder are arranged facing each other.

2. The device according to claim 1, wherein the screen is constituted of a non-magnetic material.

3. The device according to claim 1, wherein the screen is constituted of an electrically conductive material.

4. The device according to claim 1, further comprising a substrate made from organic material arranged on the substrate holder.

5. The device according to claim 1, wherein the target is arranged in a zone of the confinement mirror at the level of which the magnetic field is minimum.

* * * * *